United States Patent [19]

Nagami

[11] 4,330,719
[45] May 18, 1982

[54] CIRCUIT USING INSULATED-GATE FIELD-EFFECT TRANSISTORS

[75] Inventor: Akira Nagami, Tokyo, Japan

[73] Assignee: Nippon Electric Co., Ltd., Tokyo, Japan

[21] Appl. No.: 41,433

[22] Filed: May 22, 1979

[30] Foreign Application Priority Data

May 24, 1978 [JP] Japan .................................. 53/62670

[51] Int. Cl.³ ......................................... H03K 17/687
[52] U.S. Cl. ................................ 307/238.3; 307/304; 307/578
[58] Field of Search .................... 307/221 C, 238, 246, 307/279, 304, 578, 238.3, 238.8; 365/182, 222

[56] References Cited

U.S. PATENT DOCUMENTS

3,663,835  5/1972  Hoffman ........................... 307/238.5
3,743,862  7/1973  Bell ..................................... 307/578

*Primary Examiner*—Eugene R. La Roche
*Attorney, Agent, or Firm*—Laff, Whitesel, Conte & Saret

[57] ABSTRACT

The invention provides for maintaining a charged node point at the potential level of a power source, when the potential must be dynamically sustained. This is done by a circuit using insulated-gate, field-effect transistors. Preferably, two such transistors are used in conjunction with a bootstrap capacitor which changes the potential of a signal appearing at a circuit node responsive to any leaking of current at an output, which might otherwise cause the node potential to drift down to a lower level.

13 Claims, 8 Drawing Figures

CIRCUIT USING INSULATED-GATE FIELD-EFFECT TRANSISTORS

BACKGROUND OF THE INVENTION

The present invention relates to a circuit comprised of semiconductor elements and, more particularly, to a circuit using insulated-gate, field-effect transistors which are realized as a semiconductor integrated circuit.

A dynamic random access memory ("RAM") employing insulated-gate field-effect transistors ("IGFET") frequently encounters an inner node charged to a power source $V_{DD}$ level which must by dynamically sustained. For example, the digit line of a RAM of one transistor memory cell type is charged up to the $V_{DD}$ level to prevent a refresh high level from falling, due to the activation of the dynamic sense amplifier. When a large capacity RAM is used, such as 64 k bit or more the level of the power source $V_{DD}$ must be decreased. The trend in the field is to increase the RAM memory capacity. The demand for this type of charging scheme is expected to increase.

At the present stage, the bootstrap capacitor raises the gate level of a charging IGFET above the $V_{DD}$ level. Such a rise of the gate level puts the IGFET in the non-saturated region so that the digit line is charged to the $V_{DD}$ level. This circuit, however, has no circuit function to keep the set level after the gate level is once set up above $V_{DD}$. When subjected to a long period of timing cycle, the charge at the gate leaks off so that its potential levels downwardly. The result is that the charging level also falls. This adversely affects the operational margin. When the digit line in the single transistor memory type RAM is charged, the levels at both the input sides of the sense amplifier must be well balanced. Therefore, the gate level of the charging IGFET above the $V_{DD}$ must be stably maintained. The state of the balancing directly determines the operational margin. Some approach is needed to stabilize the charging level, therefore.

SUMMARY OF THE INVENTION

Accordingly, the primary object of the present invention is to provide a semiconductor circuit usng IGFETs which may stably sustain the gate level of the charging IGFET above the power source level.

In brief, the semiconductor circuit, according to the invention, employs an additional bootstrap capacitor. It is connected at one end to the output of the bootstrap buffer circuit or to the gate of the charging IGFET at which the potential level must be kept above the power source level. It is connected at the other end to the output of the oscillator circuit driven by the power source voltage.

According to one feature of the present invention, there is provided a semiconductor circuit comprising a first IGFET which is connected at its drain to a power source, at its gate to an input signal source and at its source to a first node. A second IGFET is connected at its drain to the power source, and at its gate to the first node. An oscillator circuit is driven by the power source. A first capacitor connects the first node to the output of the oscillator circuit. The output signal of the potential level of the power source is produced at the source of the second IGFET without decreasing the level in response to the input signal.

According to another feature of the present invention, there is also provided a circuit comprising a first IGFET which is coupled at its drain to a power source, at its gate to an input signal and at its source to a first node. A second IGFET is coupled at its drain to the power source and at its gate to the first node. A delay circuit receives the input signal at the input and produces an output signal in phase with the input signal. A first capacitor is coupled between the first node and the output of the delay circuit. An oscillator circuit is driven by the power source. A second capacitor is coupled between the first node and the output of the oscillator. That keeps the high source output level of the second IGFET at the level of the first power source, substantially in response to the input signal.

In another aspect of the invention, a circuit is obtained that comprises an IGFET having a gate to which a potential is applied constantly or operatively. A capacitor is connected at one end to the gate of the IGFET, and an oscillator circuit is connected to the other end of the capacitor. The potential may be operatively applied to the gate of the IGFET in response to an input signal.

In the above described circuits, a clock signal may be typically applied as the input signal. In that case, the frequency of the output of the oscillator circuit is set to be greater than that of the clock signal, which acts as the input signal. However, an arbitrary signal such as a data input signal, a control signal, or a fixed potential, may be applied as the input signal.

Other objects and features of the invention will be apparent from the following description, taken in connection with the accompanying drawings, in which:

DESCRIPTION OF THE PREFERRED EMBODIMENTS

In the detailed description, to be given of the invention, the transistors are all metal-oxide-semiconductor transistors (hereinafter abbreviated as "MOST"), particularly of N channel type, which are typical examples of IGFETs. A high level signal corresponds to the logical "1" level while a low level corresponds to the logical "0" level. It should be understood, however, that those transistors may readily be replaced by P channel type IGFETs.

Figure 1:
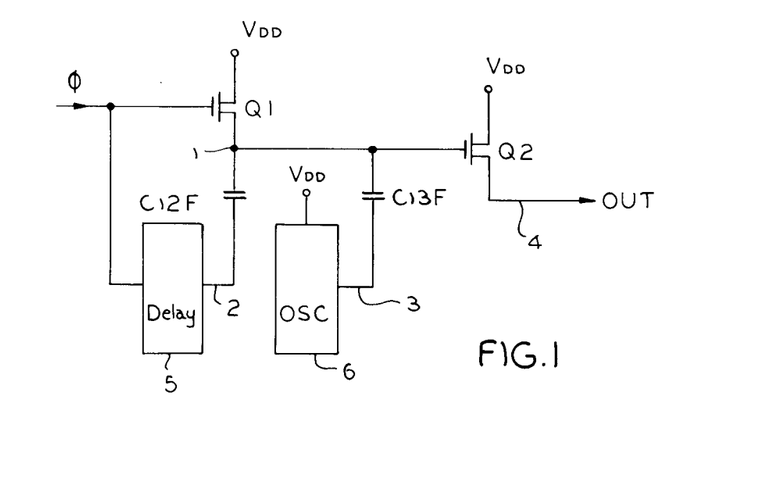
FIG. 1 schematically illustrates a basic construction of a circuit using IGFETs according to the invention.
Figure 2:
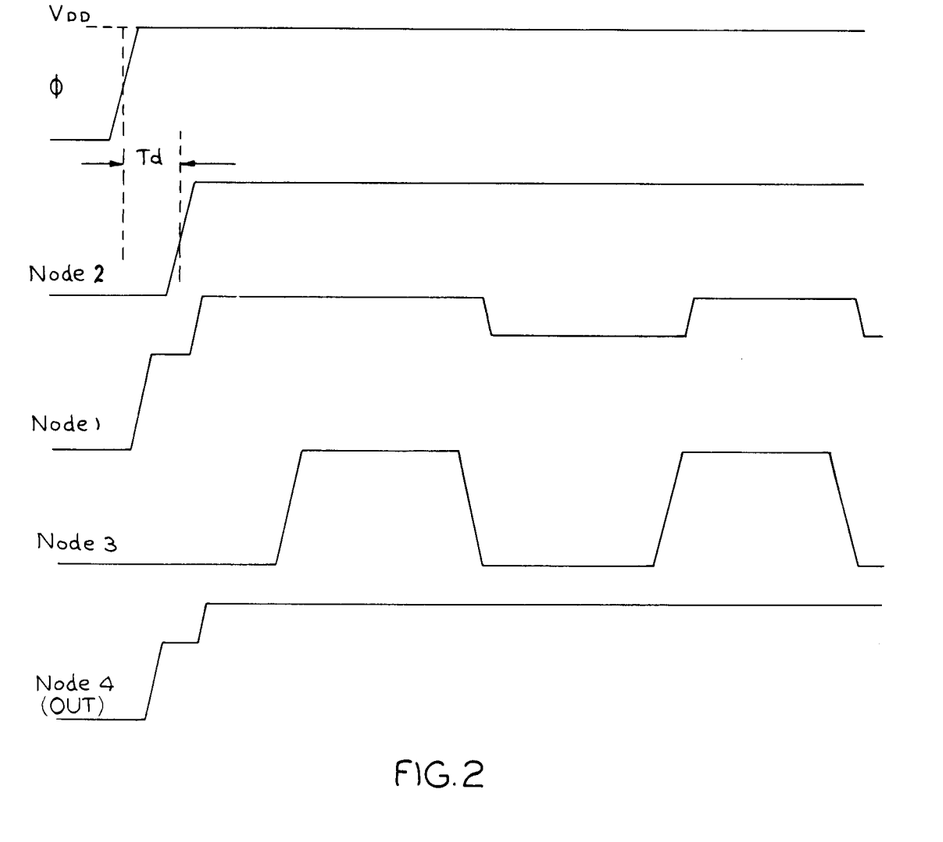
FIG. 2 shows a set of wave forms at the respective nodes in the circuit in FIG. 1.

FIG. 1, is a schematic diagram of a circuit fabricated on a semiconductor substrate which is a preferred embodiment according to the invention. It illustrates a basic construction of the semiconductor circuit. A set of timing diagrams, shown in FIG. 2, are useful in understanding the operation of the circuit shown in FIG. 1.

When a clock signal $\phi$ is at a low level, nodes 1 and 2 are at the ground level, and a node 3 is at a floating potential. The potential at a node 4 is intended to be kept at $V_{DD}$ level during a period while the clock signal $\phi$ is at a high level. The potential level at the node 4 differs depending on the place where it is used in a circuit, while the clock signal $\phi$ is low in level, but it is at the ground potential in this embodiment. As the clock signal $\phi$ rises from the low level to the high level (which is assumed to be equal to the level of the potential $V_{DD}$), the potential at the node 1 also rises through a MOST Q1 to reach a ($V_{DD}$−threshold voltage) level. With the rise of the node 1 potential, the potential at the node 4 also rises through the MOST Q2 to reach a potential level ($V_{DD}$−2×threshold voltage). While the clock signal $\phi$ enters a delay circuit 5, the potential at the node 2 is delayed for a delay time (Td), then, starts to rise, to reach the $V_{DD}$ level. Within the time period Td, a bootstrap capacitor $C_{12F}$ inserted between the nodes 1 and 2 is charged to the potential level ($V_{DD}$−threshold voltage). Upon the rise of the node 2 potential, the potential at the node 1 reaches the potential level given by the following equation:

$$V_{DD} - \text{threshold voltage} + \frac{C_{12F}}{C_1 + C_{12F}} \times V_{DD}$$

where C1 is the capacitance at the node 1. The level rise at the node 1 drives the MOST Q2 to a non-saturated region, so that the node 4 becomes $V_{DD}$ in level. The operation described thus far satisfies a given function of the circuit, but does not prevent the long-term level drop at the circuit output.

A RAM composed of MOSTs (hereinafter refered to as "MOSRAM"), having a substrate power source generating circuit for biasing the substrate at a predetermined potential, included in a single chip, was first developed in a static type MOSRAM. A dynamic type MOSRAM has been marketed recently.

In the dynamic type MOSRAM, a CR type oscillator is used as a signal generating source, and an output signal from the CR type oscillator is applied to a buffer stage. The output signal from the buffer stage is used to provide the substrate with the predetermined potential in a refreshing manner. When the buffer output signal in this dynamic type MOSRAM, in which the oscillator formed in a chip is used for level refreshing, the potential at the node 4 may be kept at the level $V_{DD}$.

The circuit shown in FIG. 1 is designed so that a bootstrap capacitor $C_{13F}$ is inserted between the node 1 and the node 3 for providing the output buffer signal from an oscillator circuit 6. After the potential at the node 4 reaches the $V_{DD}$ level, an oscillator output signal appears at the node 3. With such a circuit arrangement, the potential at the node 1 decays from high to low levels, stabilizing at the charging level of ($V_{DD}$ threshold voltage) across the capacitor $C_{12F}$. That occurs because the clock $\phi$ charges via the MOST Q1 while the charging level ($V_{DD}$−threshold voltage) is applied across the capacitor $C_{13F}$. Then, as the potential at the node 3 changes from the low level to the high level, the level at the node 1 rises to reach a level far exceeding the potential level $V_{DD}$ and given by:

$$V_{DD} - \text{Threshold voltage} + \frac{C_{13F}}{C_1 + C_{13F}} \times V_{n3} \quad (1)$$

As a result, the MOST Q2 is turned on to refresh the $V_{DD}$ level at the node 4, wherein $V_{n3}$ denotes a changed amount in potential level at the node 3. In accordance with the period of the oscillator 6, the potential level at the node 1 changes alternately between the potential given by the equation (1) and the potential ($V_{DD}$−threshold voltage). The $V_{DD}$ level at the node 4 is refreshed during the time period where the potential at the node 3 takes a value corresponding to the equation (1).

Figure 3:
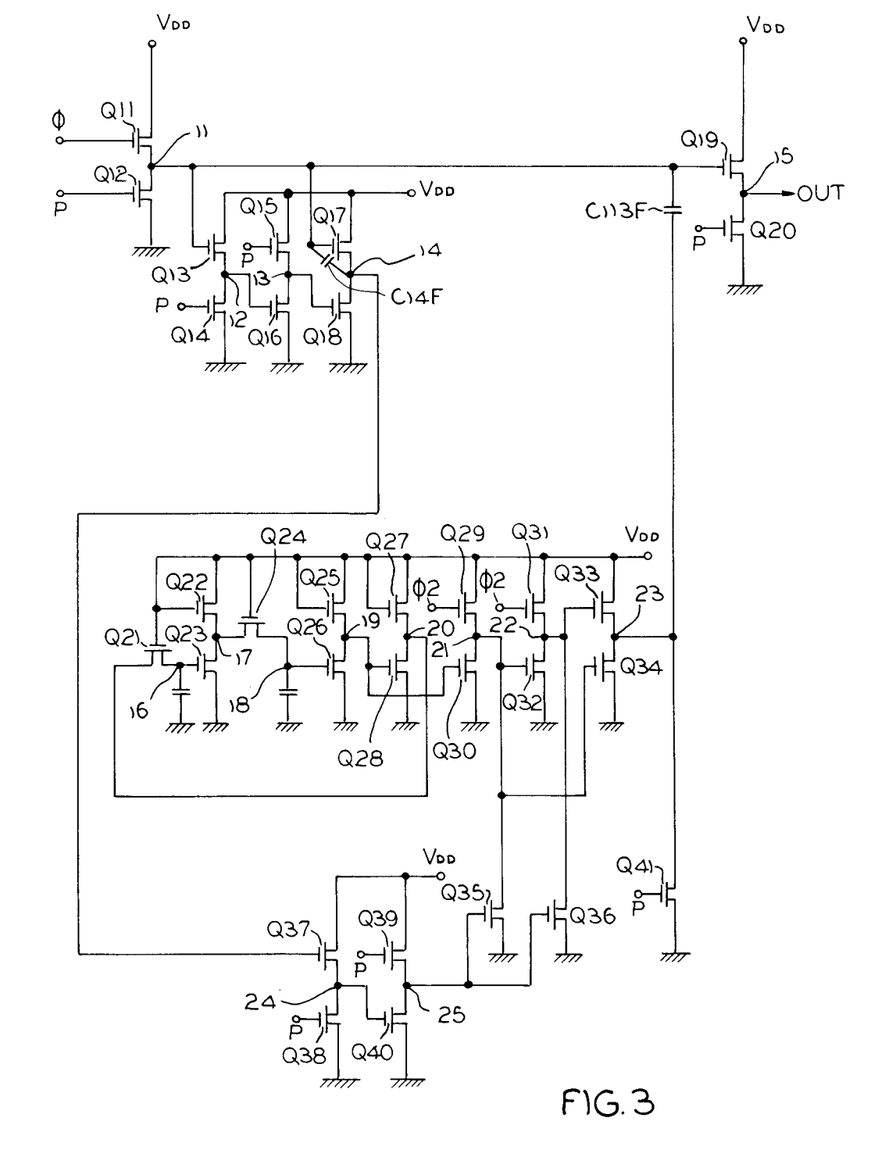
FIG. 3 shows a schematic circuit diagram which is an embodiment according to the invention.
Figure 4:
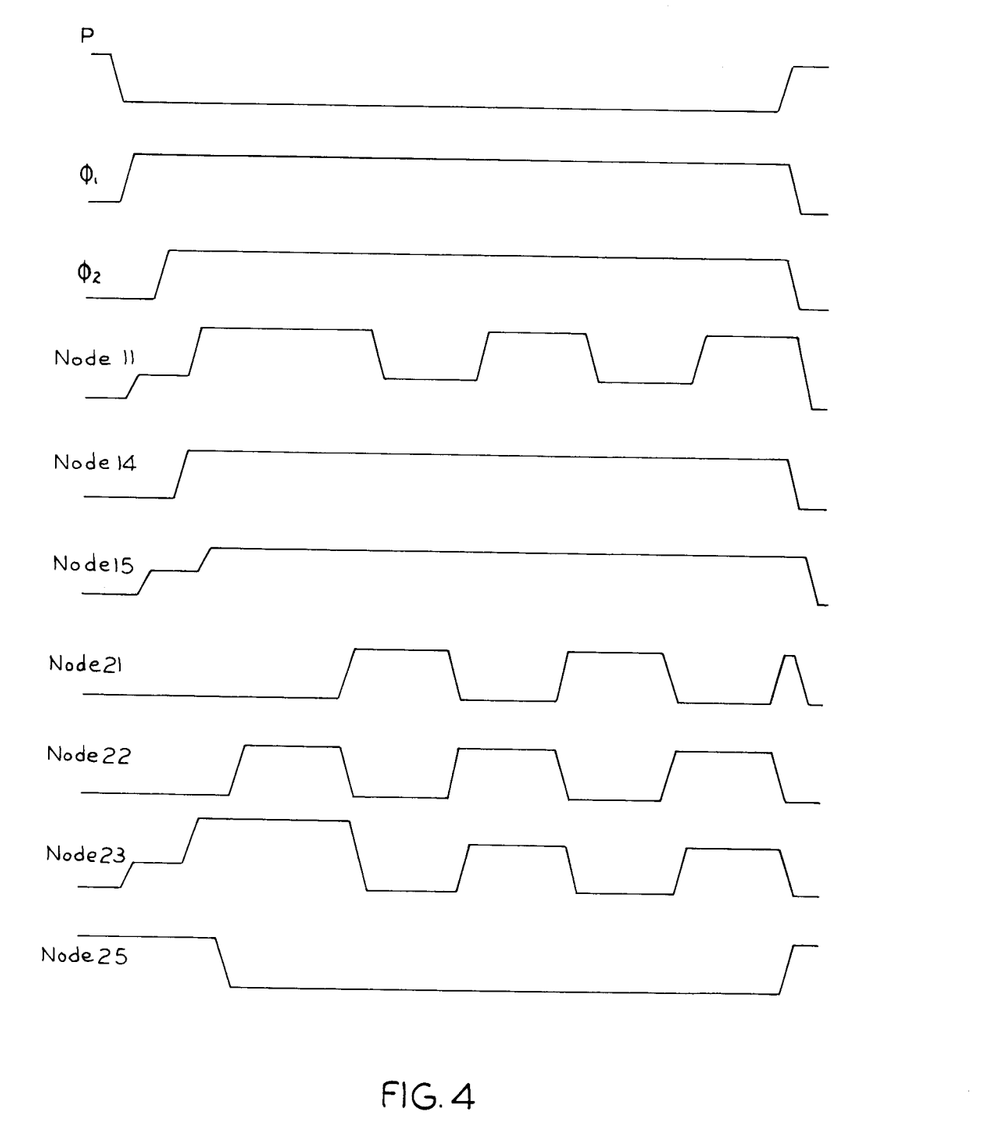
FIG. 4 shows a set of wave forms for illustrating the operation of the FIG. 3 circuit.

Turning now to FIGS. 3 and 4, a first preferred embodiment of the present invention will be described. When a precharge clock signal P is in a high level (assumed to be $V_{DD}$), the circuit is in a reset state. At this time, nodes 13 and 25 are charged to the ($V_{DD}$−threshold voltage) level while nodes 11, 12, 14, 15, 21, 22, 23 and 24 are at the ground potential. When the clock P shifts from the high level to the low level, the operation enters an active operation period. A clock $\phi$ is first activated, and its level shifts from low to high, reaching the $V_{DD}$ level. The potential at the node 11 rises through the MOST Q11 to reach the level ($V_{DD}$−threshold voltage). Then the potentials at the nodes 12 and 15 rise to reach the level ($V_{DD}$−2×threshold voltage).

The potential rise at the node 11 turns on MOST Q17. In this circuit, the current capacity of a MOST Q18 is much larger than that of the MOST Q17, by using a MOST Q17, the potential at the node 14 is restricted to a low level for charging a bootstrap capacitor $C_{14F}$. MOSTs Q33 and Q34 have been OFF since the reset period. A MOST Q41 also is turned off when the clock P becomes low. Accordingly, the node 23 is floating and following the potential at the node 11. The potential at the node 23 rises through a bootstrap capacitor $C_{113F}$ to become the level ($V_{DD}$−threshold voltage).

As a result of the potential rise at the node 12, a MOST Q16 is conductive and the potential at the node 13 is discharged to ground. When a MOST Q18 becomes nonconductive, the potential at the node 14 starts to increase through a MOST Q17. A bootstrap capacitor $C_{14F}$ raises the potential at the node 11 to a potential level given by $$V_{DD} - \text{threshold voltage} + \frac{C_{14F}}{C_{11} + C_{14F}} \times V_{14} \quad (2)$$

where C11 is the capacitance at the node 11 and V14 is the voltage at the node 14.

The MOST Q17 remains in the non-saturated region, and hence the potential of the node 14 reaches the $V_{DD}$ level. At this time, the potential at the node 23 is still floating. Therefore, the bootstrap capacitor $C_{113F}$ does not affect the potential level at the node 11, and the potential at the node 23 follows the potential at the node 11 to reach the level expressed by the equation (2). The potential rise at the node 11 forces the MOST Q19 into the non-saturated region and the potential at the node 15 rises to the $V_{DD}$ level.

The problem is keeping the potential level at the node 11, as expressed by the equation (2). When a current leakage from the node 11 to the semiconductor substrate occurs, it may cause the potential level thereat to fall. If it does, the potential at the node 11 falls to the level ($V_{DD}$−threshold level), with the clock $\phi 1$ keeping the high level at the $V_{DD}$. The potential at the node 15 also falls to the level ($V_{DD}-2\times$ threshold voltage). As a result, the node 15 does not remain at the potential $V_{DD}$.

MOSTs Q21 to Q41 and the bootstrap capacitor $C_{113F}$ maintain the $V_{DD}$ level at the node 15 in the following manner. Upon the rise of the node 14 potential, the potential at the node 24 rises to the level ($V_{DD}$—threshold voltage), through the MOST Q37. The MOST Q40 conducts and the potential at the node 25 is discharged to the ground potential. As a result, the MOSTs Q35 and Q36 become nonconductive.

Activation of a clock signal $\phi2$ need not be limited at a specific time. When the MOSTs Q35 and Q36 are not conductive, and the clock $\phi2$ is activated, an oscillator output signal appears at the nodes 21 and 22.

The MOST Q37 to Q40 constitute a delay circuit for producing an oscillator output signal after the potential at the node 15 reaches the $V_{DD}$ level. If the operation starts when the potential at the nodes 16 and 18 are low in level, the potential at the node 17 first rises through the MOST Q22 so that the node 18 is also charged through MOST Q24 and the potential thereat rises. Since the current capacity of the MOST Q26 is much larger than that of the MOST Q25, the node 19 of which the level has been made high by the MOST Q25 is level-shifted to the low level due to the potential rise at the node 18. The MOST Q28 becomes non-conductive, so that the potential at the node 20 rises through the MOST Q27. The potential at the node 16 rises through the MOST Q21 so that the potential at the node 17 is discharged. Then, the potential at the node 18 is also discharged through the MOST Q24. The result is a level fall, since the current capacity of the MOST Q23 is sufficiently larger than that of the MOST Q22. The operation is followed by the potential rise at the node 19, the potential fall at the node 20, and the potential fall at the node 16 through the MOST Q21. In this way, one cycle of the operation is completed. The period of this operation cycle is determined by the time constant (resistance of MOST Q21)×(capacitance of the node 16) and (resistance of MOST Q24)×(capacitance of the node 18).

An oscillator output signal of (with a given logical level) is given appears at the node 19 and is applied to the MOST Q30. When the clock $\phi2$ has risen and the MOSTs Q35 and Q36 have been made non-conductive, a response oscillator output signal appears at the potential level at nodes 21 and 22. As the node 19 is shifted from high to low, the MOST Q30 becomes non-conductive so that the potential at the node 21 rises through the MOST Q29 up to the ($V_{DD}$—threshold) level in such a condition that the high level of the clock $\phi2$ is $V_{DD}$ level. The MOST Q32 is selected because its current capacity is considerably larger than that of the MOST Q31. Thus, upon receipt of the potential rise at the node 21, the potential at the node 22 settles the low level.

Conversely, when the node 19 is level-shifted from low to high, the MOST Q30 is conductive so that the potential at the node 21 level-shifts to the low level. When the MOST Q32 becomes non-conductive, the node 22 starts to rise to the ($V_{DD}$—threshold voltage) level. The potentials at the nodes 21 and 22, which change periodically in an opposite phase relation, are applied to the gates of the MOSTs Q34 and Q33, respectively, so that an oscillator output signal having a high level corresponding to the ($V_{DD}-2\times$ threshold voltage) level, appears at the node 23. The bootstrap capacitor $C_{113F}$ first influences the potential level at the node 11, when the node 23 potential first becomes the low level. At this time, the node 11 falls to the level ($V_{DD}$—threshold voltage) and the bootstrap capacitor $C_{113F}$ is charged up to the level ($V_{DD}$—threshold voltage). After the node 23 potential level-shifts from low to high, the bootstrap capacitor $C_{113F}$ makes the node 11 potential rise up to about the potential level given by $$V_{DD} \text{- threshold voltage} + \frac{C_{113F}}{C11 + C_{113F}} \times \qquad (3)$$

$$(V_{DD} \text{- } 2 \times \text{threshold voltage})$$

When the potential at the node 11 is below the level ($V_{DD}$+threshold voltage), the MOST Q17 is in the saturated region and the node 14 is in the vicinity of the floating state. The bootstrap $C_{14F}$ does not fully determine the level at the node 11. The rise of the node 11 potential compels the MOST Q19 to move to the non-saturated region, thereby refreshing the $V_{DD}$ level at the node 15. Then, the node 11 receives the oscillator output from the node 23. Upon the receipt of such an output signal, the potential at the node 11 periodically changes across the bootstrap capacitor $C_{113F}$, between the potential level given by the equation (3) and the level ($V_{DD}$—threshold voltage). When the node 11 level is at the equation (3) level, the $V_{DD}$ level at the node 15 is refreshed. When the clock P shifts from low level to high level and the clocks $\phi1$ and $\phi2$ are shifted from high level to low level, the circuit is reset. The basic operation of the circuit is described above.

In the circuit shown in FIG. 3, when the node 11 falls from the equation (3) level to the level ($V_{DD}$—threshold voltage), the node 15 potential usually falls below the $V_{DD}$ level by 0.2 to 0.3 V. In most cases, this is due to the presence of the gate-to-source capacitance of the MOST Q19. Accordingly, the FIG. 3 circuit is improper when the node 15 lies on a digit line requiring a level constancy which is exactly $V_{DD}$.

Figure 5:
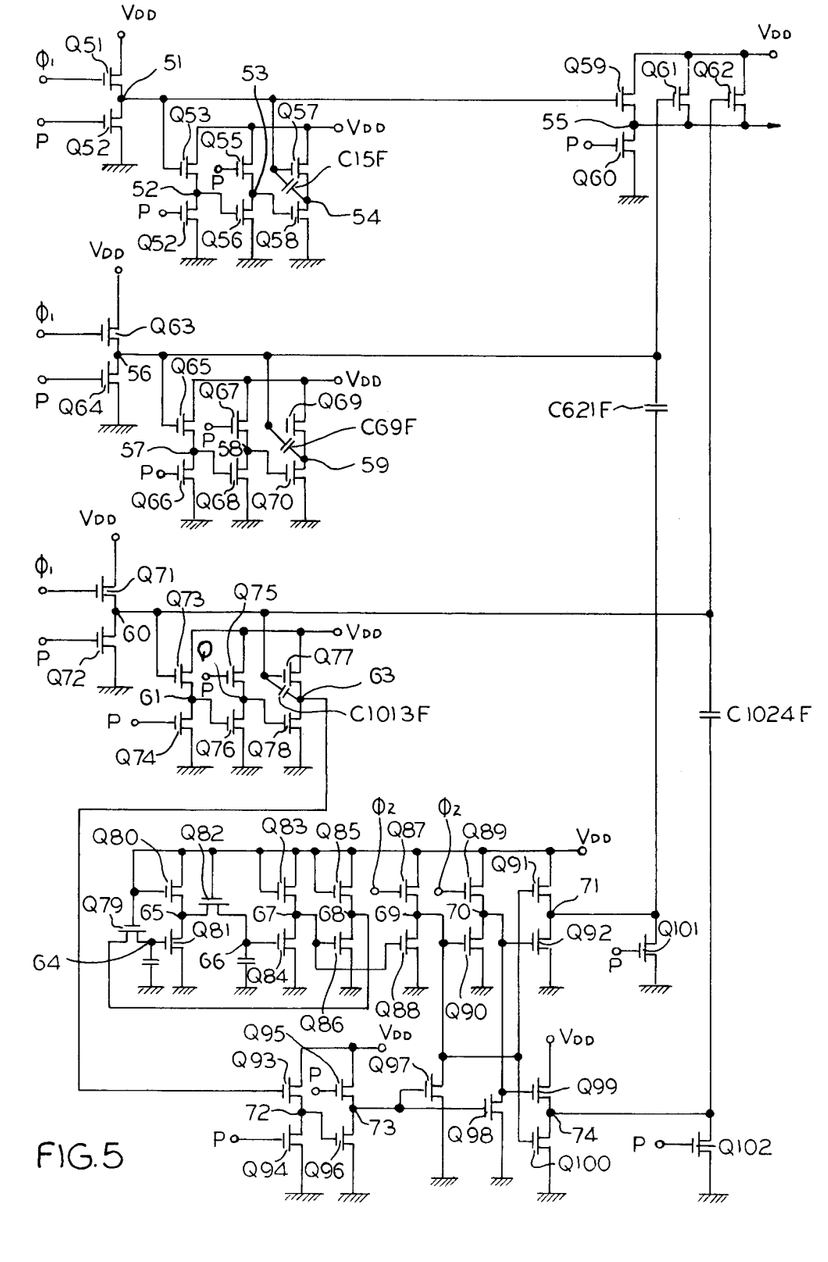
FIG. 5 shows a schematic circuit diagram of another embodiment of the semiconductor circuit according to the invention.
Figure 6:
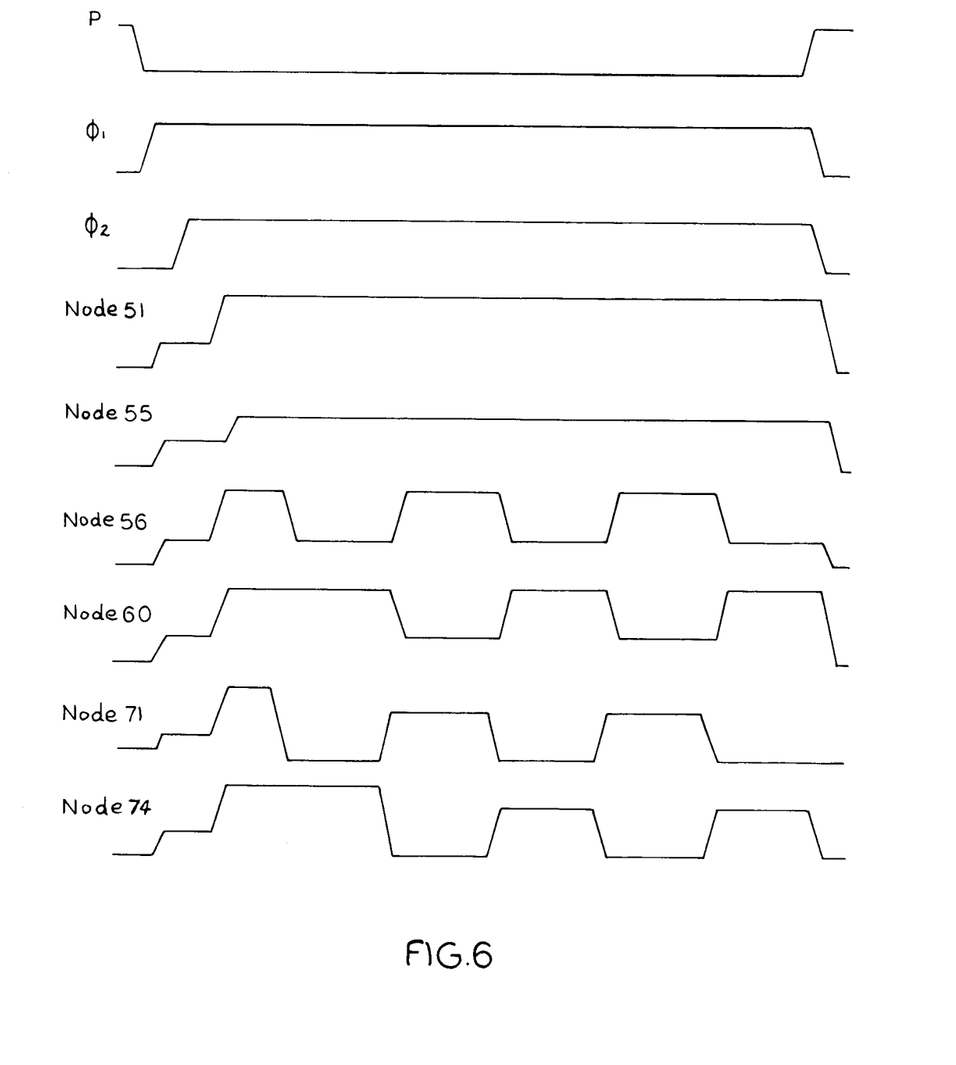
FIG. 6 shows a set of wave forms at the respective nodes in the circuit shown in FIG. 5, to explain the operation thereof.

FIG. 5 shows a circuit diagram which effectively utilizes the invention, to satisfy the above requirements. The operation of the circuit is illustrated in FIG. 6. As mentioned above, the circuit of FIG. 3 employs a single MOST for charging the node 15, where the potential must be maintained at the $V_{DD}$ level. In the arrangement shown in FIG. 5, three MOSTs Q59, Q61 and Q62 are arranged so that any one of nodes 51, 56, 60 corresponding to the gates of the MOSTs Q59, Q61 and Q62 is always at a potential level which exceeds the $V_{DD}$ level sufficiently to substain the $V_{DD}$ level at the node 55.

The clock P shifts from high level to low level and the clock $\phi1$ shifts from low level to a high level equal to the $V_{DD}$ level. In this manner, when the operation enters the active period, the potential at the node 51 first rises to the level ($V_{DD}$-threshold voltate), through a MOST Q51. There is a potential rise at the node 54, which lies at the output of a delay circuit comprising MOSTs Q53 to Q58. In response a bootstrap capacitor $C_{15F}$ raises the potential level at the node 51 to a level much higher than the $V_{DD}$ level, which is given by:

$$V_{DD} \text{- threshold voltage} + \frac{C_{15F}}{C51 + C_{15F}} \times V54$$

where C51 is the capacitance at the node 51 and V54 is the voltage at the node 54. Then, the node 55 is driven through a MOST Q59 to the level of $V_{DD}$. This level shift operation is correspondingly applied to the potential level at the nodes 56 and 6Q in the same way. Specifically, the node 56 is driven to have the potential level given below:

$$V_{DD} - \text{threshold voltage} + \frac{C_{69F}}{C56 + C69F} \times V59$$

where C56 is the capacitance at the node 56 and V59 is the potential variation in the node 59.

The node 60 is driven to have the potential level given by:

$$V_{DD} - \text{threshold voltage} + \frac{C_{1013F}}{C60 + C_{1013F}} \times V63$$

where C60 is the capacitance at the node 60 and V63 is the potential variation in the node 63. These potentials which greatly exceed the $V_{DD}$ voltage, drive the MOSTs Q61 and Q62 to the non-saturation region and place the node 55 at the $V_{DD}$ level.

In this way, the circuit arrangement charges the node 55 to the level $V_{DD}$ by operating three identical circuit blocks, parallel. Therefore, the current capacity of the MOSTs used in this circuit arrangement is ⅓ as large as that of the MOSTs used in the FIG. 3 circuit. As in the previous case, the level at the node 51 remains raised. If the current leaks, causing a decrease in the potential level thereat, the potential level at the nodes 56 and 60 are raised alternately to which is a level higher than the level $V_{DD}$ for sustaining the $V_{DD}$ level at the node 55.

As described above, the clock $\phi 2$ is activated and the node 73 is discharged so that MOSTs Q97 and Q98 are nonconductive. At this time, oscillator output signals appear at nodes 69 and 70, where the phases are in an opposite relation. As the clock $\phi 2$ rises to a high level of $V_{DD}$, the potentials at the nodes 69 and 70 rise to the level ($V_{DD}$-threshold voltage). Under this condition, if the node 69 is at the high level while the node 70 is at the low level, the potential at the node 71 rises to reach the level ($V_{DD}$-2×threshold voltage) level and a node 74 is at the ground potential. Conversely, when the node 69 is low while the node 70 is high, the node 71 is at the ground potential and the potential at the node 74 rises to the level ($V_{DD}$-2×threshold voltage). Thus, the nodes 71 and 74 also have alternately oscillating output signals with opposite phases. When the node 71 is at the low level, the potential level at the node 56 (which is influenced by the output signal from the node 71) shifts to the high level of ($V_{DD}$-threshold voltage). On the other hand, when it is at the high level, it settles to a level well exceeding the $V_{DD}$ given by $$V_{DD} - \text{threshold voltage} + \qquad (4)$$

$$\frac{C_{621F}}{C56 + C_{621F}} (V_{DD} - \text{threshold voltage})$$

Similarly, the node 74 influences the node 74, through a bootstrap capacitor $C_{1024F}$. As a result, when the node 74 is low, its potential becomes the level ($V_{DD}$-threshold voltage). At the high level of the node 74, it well exceeds the $V_{DD}$ level to be $$V_{DD} - \text{threshold voltage} + \qquad (5)$$

$$\frac{C_{1024F}}{C60 + C_{1024F}} \times (V_{DD} - 2 \times \text{threshold voltage})$$

where C60 is a capacitance at the node 60.

In this manner, the potentials at the nodes 56 and 60 alternately exceed the level $V_{DD}$. The result is that during the operation, one of the MOSTs Q61 and Q62 is always in the non-saturated region. The $V_{DD}$ level at the node 55 is sustained even if the level at the node 51 falls. For example, when the potential at the node 56 decreases from the equation (4) level to the ($V_{DD}$-threshold voltage) level, the gate-source capacitance of the MOST Q61 causes the potential at the node 55 to fall slightly. However, the potential at the node 60 rises from the ($V_{DD}$-threshold voltage) level to the equation (5) level. Accordingly, the gate-source capacitance of the MOST Q62 causes the potential to inversely rise by the same amount. As the result, those potential changes are set off against each other. In this manner, the $V_{DD}$ level at the node 55 is sustained.

As described above, each of the arrangements of FIGS. 1 through 6 is constructed so that its output signal is changed from low level to the power source $V_{DD}$ level in synchronism with the input clock $\phi$ or $\phi 1$. As long as the clock $\phi$ or $\phi 1$ is a high level, the output signal is kept at the $V_{DD}$ level. In some modifications, the power source level $V_{DD}$ may be kept independently of the input clocks.

Figure 7:
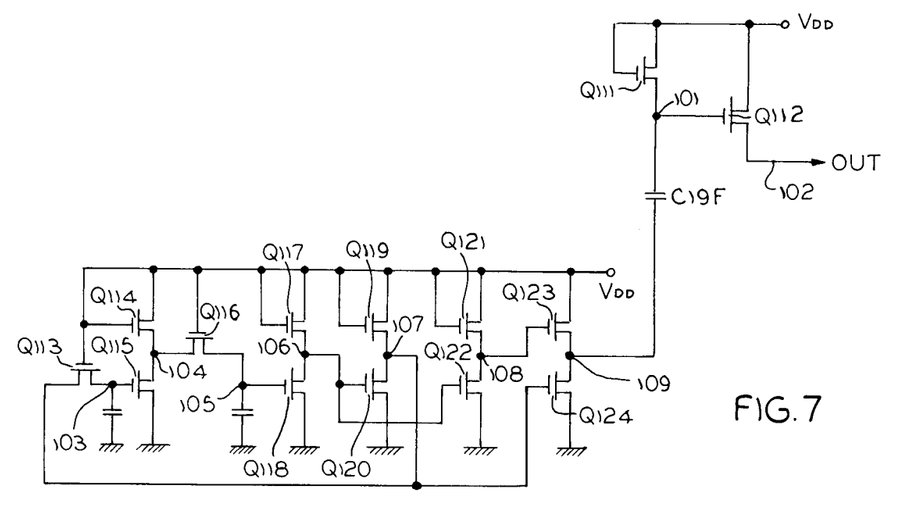
FIGS. 7 and 8 show schematic circuit diagrams of further embodiments of the circuit according to the invention.
Figure 8:
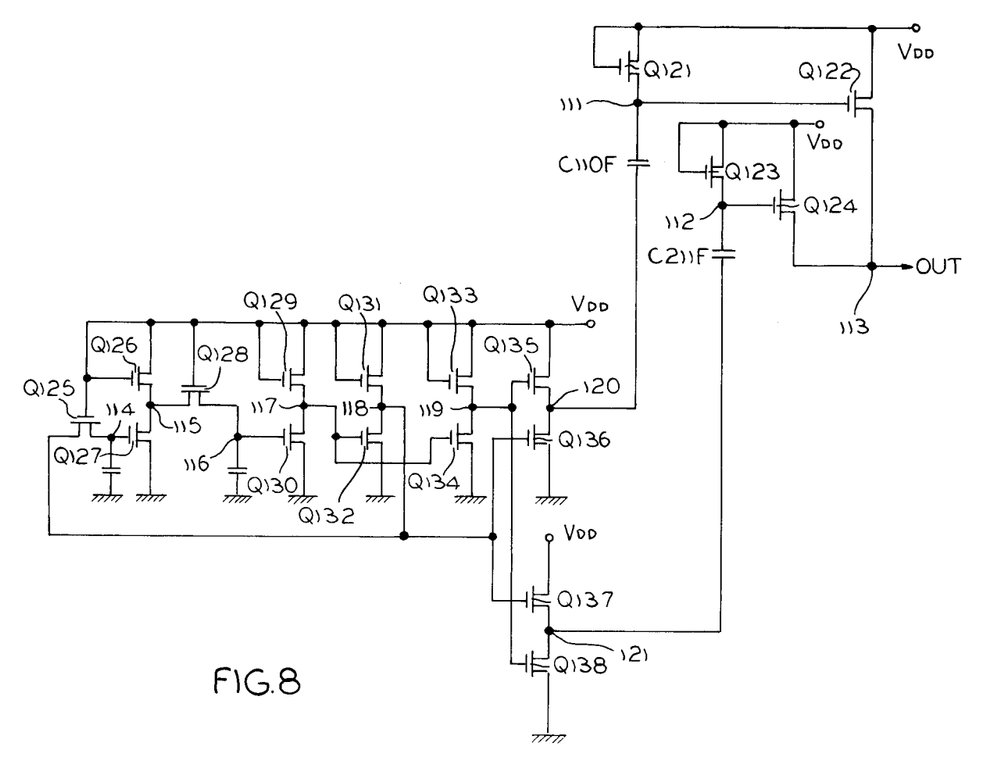

Such modifications, which are used as power source circuits, are illustrated in FIGS. 7 and 8. The circuit arrangement shown in FIG. 7 corresponds to that shown in FIG. 3. The output $V_{DD}$ level at the node 102 is periodically refreshed. Further, while the level of the potential at the node 101 drifts down to the level ($V_{DD}$-threshold voltage), the level at the node 102 falls slightly below the $V_{DD}$ due to the gate-source capacitance of the MOST Q112. In the circuit arrangement shown in FIG. 8, which corresponds to the circuit shown in FIG. 5, the potentials at the nodes 111 and 112 alternately rise to well above the $V_{DD}$ level. This stabilizes the potential level of the node 113 at the $V_{DD}$ level.

The embodiments described thus far apply when only enhancement type MOSTs are used. However, the present invention is most effective where the depletion type MOST is used for the load MOST, and the power source voltage is made to fall e.g. $V_{DD} = +5$ V TYP.

The present invention also uses a bootstrap capacitor connecting at one end to the gate of the charging MOST, and at the other end to the buffer output of the oscillator circuit. This prevents the potential levels of the gate and the output $V_{DD}$ from drifting down due to the current leakage. For example, when used with an oscillator circuit such as a power source circuit included in a chip, the gate level of the charging MOST is periodically refreshed to a level well above the $V_{DD}$ voltage. This stabilizes the output at the $V_{DD}$ level.

I claim:

1. A circuit comprising a first insulated-gate, field-effect transistor coupled at its drain to a power source, at its gate to a signal input terminal and at its source to a first circuit node, a second insulated-gate, field-effect transistor which is coupled at its drain to said power source and at its gate to said first node, an oscillator circuit means driven by the said power source, and a first capacitor coupled between said first node and the output of said oscillator circuit means, whereby an output signal having a potential level of said power source appears at the source of said second transistor in response to an input signal appearing at said input terminal.

2. The circuit according to claim 1, further comprising a delay circuit having an input terminal for receiving said input signal and a second capacitor coupled between the source of said first transistor and an output terminal of said delay circuit.

3. The circuit according to claim 2, wherein said input signal has a potential of said power source.

4. A circuit comprising a first insulated-gate, field-effect transistor having a drain supplied from a power source and a gate supplied with an input signal, a first capacitor means having a first electrode coupled to the source of said first transistor, a delay circuit means having an input electrode supplied with said input signal and an output electrode coupled to a second electrode of said first capacitor means, a second insulated-gate, field-effect transistor having a drain supplied with said power source and a gate coupled to a source of said first transistor, a second capacitor means having a first electrode coupled to said gate of said second transistor and an oscillator means having an output terminal coupled to a second electrode of said second capacitor means.

5. A circuit comprising a first insulated-gate, field-effect transistor which is coupled at its drain to a power source, at its gate to an input terminal and at its source to a first node, a second insulated-gate, field-effect transistor which is coupled at its drain to said power source and at its gate to the first node, a delay circuit means coupled to receive said input signal and to produce an output signal in phase with said input signal, a first capacitor coupled between said first node and an output terminal of said delay circuit mean, an oscillator circuit means driven by said power source, a second capacitor coupled between said first node and the output of said oscillator means, whereby an output signal maintained at a potential level of said power source is produced at the source of said second transistor in response to said input signal.

6. The circuit according to claim 1, 4 or 5, wherein said input signal is a clock signal and the frequency of the output signal of said oscillator circuit means is greater than that of said clock signal.

7. A circuit comprising a power terminal for receiving a power voltage, a bootstrap node, a first insulated-gate field-effect transistor, means for connecting a drain of said first insulated-gate field-effect transistor to said power terminal, means for connecting a gate of said insulated-gate field-effect transistor to said bootstrap node, a second insulated-gate field-effect transistor having a source coupled to said bootstrap node, a first capacitor coupled to said bootstrap node, control means responsive to input signals of a given frequency for controlling said first capacitor and said second insulated-gate field-effect transistor to generate a potential having a value which is larger than said power voltage as it appears at said bootstrap node, a second capacitor having a first terminal coupled to said bootstrap node, oscillator means for generating an oscillation signal, and means for supplying said oscillation signal to a second terminal, whereby output signals having the same value as said power voltage are derived from a source of said first insulated-gate field-effect transistor, substantially in response to said input signals.

8. The circuit according to claim 7, in which said control means includes a delay circuit means for generating delay signals responsive to said input signals, and means for supplying said delay signals to a second terminal of said first capacitor.

9. The circuit according to claim 7, in which said oscillation signal has a frequency which is higher than the frequency of said input signals.

10. An output circuit comprising first to third nodes, a power supply terminal for receiving a power voltage; first bootstrap circuit means responsive to input signals for operatively raising a potential at said first node to a level which is higher than the level of said power voltage; second bootstrap circuit means responsive to said input signals for operatively raising a potential at said second node to a level which is higher than the level of said power voltage; third bootstrap circuit means responsive to said input signals for operatively raising a potential at said third node to a level which is higher than the level of said power voltage; an output terminal; a first insulated-gate field-effect transistor having a drain coupled to said power supply terminal, a gate coupled to said first node, and a source coupled to said output terminal; a second insulated-gate field-effect transistor having a drain coupled to said power supply terminal, a gate coupled to said second node, and a source coupled to said output terminal; a third insultated-gate field-effect transistor having a drain coupled to said power supply terminal, a gate coupled to said third node and a source coupled to said second node; a second capacitor having a first terminal coupled to said third node; first means for generating a first oscillation signal with a given phase; second means for generating a second oscillation signal having different phase from said given phase; third means for supplying a second terminal of said first capacitor with said first oscillation signal; and means for supplying a second terminal of said second capacitor with said second oscillation signal, whereby an output signal of said power voltage is derived from said output terminal, in response to said input signals.

11. A circuit comprising a plurality of insulated-gate field-effect transistors, means for supplying drains of said plurality of insulated-gate field-effect transistors from a power source, a plurality of capacitors each having a first terminal coupled to a gate of an associated one of said field-effect transistors, a plurality of oscillating means for generating oscillation signals having different phases, means for supplying said oscillation signals to second terminals of said capacitors, an output terminal, and means for commonly connecting sources of said plurality of insulated-gate field-effect transistors to said output terminal.

12. The circuit according to claim 11, further comprising a reset insulated-gate field-effect transistor coupled between said output terminal and a terminal receiving a ground potential.

13. An output circuit comprising means for receiving an input signal, a drive node, means for receiving a power voltage, bootstrap circuit means responsive to said input signal for operatively raising a potential at said drive node above said power voltage, the raised potential being maintained capacitively and having a tendency to be reduced responsive to an elapse of time, an insulated-gate field-effect transistor having a drain coupled to receive said power voltage and a gate coupled to said drive node, an output terminal, a capacitor having a first terminal coupled to said drive node, means for generating a repetitive sequence of signals, and means for supplying a second terminal of said capacitor with said repetitive signals, whereby a level of said raised potential is maintained above said power voltage.

* * * * *

UNITED STATES PATENT AND TRADEMARK OFFICE
CERTIFICATE OF CORRECTION

PATENT NO. : 4,330,719

DATED : May 18, 1982

INVENTOR(S) : NAGAMI, Akira

It is certified that error appears in the above—identified patent and that said Letters Patent is hereby corrected as shown below:

Col. 3, Line 26, delete "the following equation";

Col. 3, Line 48, insert a comma --,-- after "potential".

Col. 5, Line 45, delete "is given";

Col. 5, Line 57, insert --to-- after "settles".

Col. 6, Line 45, "of" should be --in--;

Col. 6, Line 53, "substain" should be --sustain--.

Col. 7, Line 5, "6Q" should be --60--;

Col. 7, Line 21, insert a comma --,-- after "potentials";

UNITED STATES PATENT AND TRADEMARK OFFICE
CERTIFICATE OF CORRECTION

PATENT NO. : 4,330,719
DATED : May 18, 1982
INVENTOR(S) : NAGAMI, Akira

It is certified that error appears in the above—identified patent and that said Letters Patent is hereby corrected as shown below:

Col. 7, Line 28, insert --in-- before "parallel";

Col. 7, Line 65, "74" should be --60--.

Col. 8, Line 20, "the" (second occurrence) should be --a--.

Signed and Sealed this

Seventeenth Day of August 1982

[SEAL]

Attest:

Attesting Officer

GERALD J. MOSSINGHOFF

Commissioner of Patents and Trademarks